(12) United States Patent
Bawa

(10) Patent No.: US 11,483,124 B2
(45) Date of Patent: Oct. 25, 2022

(54) CLOCK AND DATA RECOVERY PROCESSOR, MEASUREMENT DEVICE AND METHOD

(71) Applicant: ROHDE & SCHWARZ GMBH & CO. KG, Munich (DE)

(72) Inventor: Iqbal Bawa, Portland, OR (US)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/185,523

(22) Filed: Feb. 25, 2021

(65) Prior Publication Data

US 2022/0271911 A1 Aug. 25, 2022

(51) Int. Cl.
*H04L 7/00* (2006.01)
*H04L 25/49* (2006.01)
*G01R 19/25* (2006.01)

(52) U.S. Cl.
CPC ........ *H04L 7/0016* (2013.01); *G01R 19/2509* (2013.01); *H04L 7/0079* (2013.01); *H04L 25/4917* (2013.01)

(58) Field of Classification Search
CPC . H04L 7/0016; H04L 7/0079; H04L 25/4917; H03K 9/02; G01R 19/2506; G01R 19/2509
See application file for complete search history.

(56) References Cited

U.S. PATENT DOCUMENTS

| | | | |
|---|---|---|---|
| 8,594,262 B2* | 11/2013 | Slezak | H04L 25/4917 375/360 |
| 10,083,148 B2* | 9/2018 | Shauck | G01R 19/2509 |
| 2010/0141308 A1 | 6/2010 | Villarino-Villa et al. | |

FOREIGN PATENT DOCUMENTS

| EP | 1071241 A1 | 1/2001 |
|---|---|---|
| EP | 3089397 A1 | 11/2016 |

\* cited by examiner

*Primary Examiner* — Betsy Deppe
(74) *Attorney, Agent, or Firm* — Brooks Kushman P.C.

(57) ABSTRACT

The present disclosure provides a clock and data recovery processor for recovering timing information from a measured signal with a data input interface configured to receive samples representing the measured signal, a level comparator coupled to the data input interface and configured to determine the signal level for each of the received samples in a group comprising a predetermined number of samples, a transition comparator coupled to the level comparator and configured to compare the number of signal transitions for the samples in the group with a predetermined transition number, and a bit value determiner coupled to the transition comparator and configured to determine bit values for data symbols in the measured signal based on the detected transitions, if the transition comparator determined the number of signal transitions being equal to or larger than the predetermined transition number. Further, the present disclosure provides a measurement device and a respective method.

15 Claims, 6 Drawing Sheets

CLOCK AND DATA RECOVERY PROCESSOR, MEASUREMENT DEVICE AND METHOD

TECHNICAL FIELD

The disclosure relates to a clock and data recovery processor, a measurement device and a respective method.

BACKGROUND

Although applicable to any measurement system, the present disclosure will mainly be described in conjunction with measurement systems for digital NRZ (non-return to Zero) signals or PAM (pulse-amplitude modulation) signals.

Measurement devices such as oscilloscopes are used in a variety of different applications. Users may for example want to analyze signals in multi-lane high speed serial data busses, like PCIE. Such data busses may transmit data with high data rates of up to 8 Gb/s in the case of a PCIE3 data bus.

In order to measure signals of such data busses, complex measurement devices with very high sampling rates are required.

There is a need for allowing measurement of high data rate signals with low-complexity measurement devices.

SUMMARY

The above stated problem is solved by a clock and data recovery processor with the features of claim 1, a measurement device with the features of claim 8, and clock and data recovery method with the features of claim 9. It is understood, that independent claims of a claim category may be formed in analogy to the dependent claims of another claim category.

Accordingly, it is provided:

A clock and data recovery processor for recovering information from a measured signal, the clock and data recovery processor comprising a data input interface configured to receive samples representing the measured signal, a level comparator coupled to the data input interface and configured to determine the signal level for each of the received samples in a group comprising a predetermined number of samples, a transition comparator coupled to the level comparator and configured to determine a number of signal transitions in the group and to compare the number of signal transitions for the samples in the group with a predetermined transition number, and a bit value determiner coupled to the transition comparator and configured to determine bit values for the bits in the measured signal based on the detected transitions, if the transition comparator determined the number of signal transitions being equal to or larger than the predetermined transition number.

Further, it is provided:

A measurement device comprising a number of signal interfaces each configured to measure a signal, and a clock and data recovery processor coupled to the signal interfaces.

Further, it is provided:

A clock and data recovery method for recovering information from a measured signal, the clock and data recovery method comprising receiving samples representing the measured signal, determining the signal level for each of the received samples in a group comprising a predetermined number of samples, comparing the number of signal transitions for the samples in the group with a predetermined transition number, and determining bit values for the bits in the measured signal based on the detected transitions, if the number of signal transitions is equal to or larger than the predetermined transition number.

In modern communication system the communication channel may omit the clock signal to reduce the number of signal lines. The clock is implicitly transmitted by the single data symbols in such communication systems. The receiver of such a signal must, therefore, extract timing information from the serial data stream in order to decode the transmitted symbols.

The same applies to measurement devices. If a measurement device is to be used for measuring signals in a communication system that does not explicitly transmit a clock signal, the timing information needs to be recovered in the measurement device from the measured signals, such that the signal may be sampled at the correct points in time.

The process of regenerating the timing information may also be called clock and data recovery or CDR. In conventional oscilloscopes a high sampling rate is usually required for a robust CDR, for example, 4-5 times the bit rate of the signal to be measured. For example, in case of PCIE3, Peripheral Component Interconnect Express 3, where the bit rate is 8 Gb/s, a conventional oscilloscope would require a sampling rate of 32 to 40 Gb/s. Oscilloscopes with such high sampling rates are very complex and therefore also expensive.

Conventional oscilloscopes may for example use interleaving to provide higher sampling rates and enhanced bandwidth. Interleaving uses multiple measurement units of an oscilloscope to measure a signal at consecutive points in time and, therefore, restricts the number of channels that may be measured at the same time. A reduced number of channels that may be measured concurrently, however, is a disadvantage when measuring signals in multi lane systems such as PCIE3.

The present disclosure therefore provides a CDR that operates with a sampling frequency that is only 2-3 times the bit rate of the data signal that is to be measured, which in the case of a PCIE3 signal with 8 Gb/s is about 20 Gb/s. Using the CDR of the present disclosure therefore allows measuring high speed signals without using an interleaving system, and therefore allows measuring an increased number of signals concurrently.

The present invention provides the clock and data recovery processor that uses windows with varying lengths in order to recover the timing information of a measured signal and to determine the bit values of the bits in the signal.

The clock and data recovery processor receives the samples that represent the measured signal via the data input interface, from which the samples are provided to a level comparator. The level comparator determines the levels of samples in groups of samples, wherein each group of samples comprises a predetermined number of samples. The level comparator may, for example, compare the levels of the samples to a predetermined value. Such a value may be at about 50% of the difference between the high and low level of the signal, for example, 50% of 5 V-0 V i.e., 2.5 V, or 3.3 V-0 V i.e., 1.65 V. A fixed value may, for example, be used for NRZ signals, also called non-return to Zero signals. It is understood, that for other types of signals, like for example for PAM signals, also called pulse-amplitude modulation signals, a variable value may be used by the comparator or a value that is low enough to detect all pulses. For example, for single polarity PAM signals the level comparator may determine if the signal is higher than 0 V. A threshold value may also be taken into account by the level comparator, and the level comparator may accept all samples to have a positive value that comprise a level higher than 0 V plus the threshold value. For double polarity PAM signals, the level comparator may determine if the respective sample level is larger or smaller than 0 V to assign that sample a positive value i.e., a value different from zero. Again, a respective threshold value may be taken into account by the level comparator. The level comparator may then output a logic 1 or 0 as the respective signal level. It is understood, that another percentage may be used, as long as the signal level may be determined with sufficient accuracy. For bi-polar signal, the level comparator may compare the signal levels e.g., with 0 V.

After determining the signal levels, the transition comparator compares the number of signal transitions for the samples in the group with a predetermined transition number. The predetermined transition number may be defined based on the type of the measured signal. The transition comparator may determine the number of transitions by comparing the signal levels of consecutive samples.

For example, in PCIE3 the EIEOS packet has 8 blocks of 8 zeros and 8 ones consecutively. This pattern used in PCIE3, therefore, has no transitions for up to 64 bits. Generally, all NRZ, non-return to zero, signals may comprise long patterns without transitions. Known systems use a fixed window length, and therefore may not reliably generate a clock signal from such patterns. For example, a PLL, phase locked loop, of such systems may not be able to lock on the signal for lack of transitions.

In the clock and data recovery processor, the predetermined number may be set to 8 for PCIE3 signals. For USB3 signals, the predetermined number may be set to 12.

The bit value determiner only determines the bit values for the samples, if enough transitions are provided in the group. A group with the required number of transitions allows reliably determining the bit timing.

The bit value determiner may, for example, determine a sample time for each data symbol based on the timing of the detected transitions and then compare the value of the sample that is represented by the respective sample time with a respective threshold value to determine the bit value. The term data symbol may be seen as the smallest information carrying signal unit in the respective communication system. For NRZ signals the value may, as explained above, be a fixed value of, for example, 50% of 3.3 V or 50% of 5 V, or any other application-dependent value, and may represent a digital 1 or 0 i.e., one single bit. It is understood that for PAM signals the bit value determiner may use another system for determining the bit value, e.g., via a look-up table that provides respective bit values for different signal levels. A single bit value for PAM signals or PAM data symbols may define two or more bits, depending on the number of possible pulse amplitudes used in the respective communication system. If, for example, a 4-level PAM modulation is used, 4 pulse amplitudes are possible that may define the value of a two-bit tuple, i.e., 00, 01, 10 or 11. If, for example, an 8-level PAM modulation is used, 8 pulse amplitudes are possible that may define the value of a four-bit tuple. More pulse amplitudes are also possible.

Therefore, the clock and data recovery processor allows determining if a group of samples is adequate for determining the bit values or not. In case that the samples in a group are adequate i.e., comprise enough transitions, the bit values are determined accordingly.

The method used by the clock and data recovery processor may also be called a Non Decision Directed clock recovery method with dynamically varying window length.

If, however, the samples in the group are not adequate, the respective group may be identified and respective measures may be taken, as will be explained in more detail below.

Further embodiments of the present disclosure are subject of the further dependent claims and of the following description, referring to the drawings.

In an embodiment, the clock and data recovery processor may comprise a group adaptor configured to increase the number of samples in the group if the number of signal transitions in the group is below the predetermined transition number. The level comparator may be configured to re-determine the signal level for each of the received samples in the group with the sample number increased by the group adaptor.

In case that a group of samples does not comprises the required number of transitions, the clock and data recovery processor of the present disclosure uses the group adaptor to increase the number of samples in the group. As indicated above, for PCIE3 signals the predetermined transition number may be eight and for USB 3 signals 12. For other signals, the predetermined transition number may be different.

If the group adaptor increases the number of samples in the group, the level comparator will determine the signal level for each of the received samples in the group again.

By increasing the number of samples in a group, additional transitions may be provided in the group. Therefore, by increasing the number of samples it may become possible to determine the bit values for data symbols in a group that previously did not comprise enough transitions.

In a further embodiment, the group adaptor may be configured to increase the number of samples in the group by adding a predetermined amount to the predetermined number of samples.

The predetermined amount may be between 1 and 10 samples, especially 5 samples or 4 samples or 3 samples or 2 samples or 1 sample. It is understood, that the predetermined amount may be adapted depending on the type of signals that are to be measured e.g., by a user.

In another embodiment, the group adaptor may be configured to increase the number of samples in the group and the level comparator may be configured to re-determine the signal level for each of the received samples in the group, until the number of samples in the group is equal to or higher than the predetermined transition number.

If with a first increase, the predetermined number of samples is not reached for the group, the process of increasing the size of the group and determining the number of transitions may be repeated until the predetermined number of transitions is reached.

After the predetermined number of transitions is reached for the group, the bit value determiner determines the bit values for the data symbols in the measured signal based on the detected transitions for the group, i.e., based on a larger number of samples and at least the required number of transitions.

Instead of determining the transitions based on a fixed group or window and using the same determined sample timing for sampling the data in the entire group or window, the clock and data recovery processor in this embodiment, determines the bit values based on the next consecutive data symbols by increasing the windows size i.e., the number of samples in the group, if the samples in the present group do not comprise enough transitions.

This approach provides for a dynamic window length, so as to always provide enough transitions to make a decision on the sample timing. As mentioned above, some of the patterns used in PCIE3 have no transitions for up to 64 bits, and with a fixed window length the clock in a PLL could free run based on only one transition. Such a behavior may lead to wrong sampling of the data. This will put more stringent requirements on the equalizer block, like the CTLE, continuous-time linear equalizer, and the DFE, decision feedback equalizer.

Further, by setting the minimum number of samples i.e., the original predetermined number of samples, the number of transitions is also limited. A high number of transitions would filter out any jitter that should be accounted for. By varying the window size i.e., the number of samples in each group, based on the acquired transitions, it is possible to determine the timing for each data symbol based on a known number of transitions and a stable sample timing may be determined, while at the same time jitter may be corrected.

In yet another embodiment, the level comparator may be configured to use a different sample as the first sample of the group, when re-determining the signal level than used as the first sample for the group in the prior determining of the signal levels.

If during assessment of a group it is determined that there do not exist enough transitions for determining the bit values, the number of samples in the group may be increased, as already indicated above.

In addition, the starting position of the group with regard to the measured signal may be shifted by selecting a different sample as the first sample in the group. It is understood, that the samples are processed in the order in which they are recorded. Therefore, the group may be seen as a sliding group or sliding window with varying length that is shifted to other recorded samples every iteration of determining the signal levels.

In a further embodiment, the level comparator may be configured to use a sample, which is recorded later than a first sample for the group in the prior determining, as the first sample of the group when re-determining the signal level.

As explained above, the group may be defined as a sliding group. In order to decrease the influence of sections with little transitions in the measured signal, the group may be shifted or moved to samples that are recorded later than the samples that where assessed in a prior iteration and did not result in enough samples.

In another embodiment, the level comparator and/or the transition comparator and/or the bit value determiner may be configured to disregard groups that comprise no transitions.

Low frequency segments, like the above-indicated special patterns that may be present in some communication systems, usually do not comprise the information that is required to determine a bit timing or data symbol timing. Therefore, in order to reduce the computational effort, groups that comprise no transitions maybe omitted completely during the assessment of the measured signal. For example, if the transition comparator determines the number of transitions to be zero, it may instruct the bit value determiner to output a respective bit value that represents the static value of the samples in the group.

It is understood, that the user may for such sections simply be presented with the respective signal level i.e., a 0 or 1 level.

It is understood, that any of the elements of the clock and data recovery processor such as, for example, the data input interface, the level comparator, the transition comparator and/or the bit value determiner and/or group adaptor may each be provided as a dedicated processing element, such as, for example, a processing unit, a microcontroller, a field programmable gate array (FPGA), a complex programmable logic device (CPLD) or the like, or may be provided combined in a single processing element. The elements of the clock and data recovery processor may at least in part also be provided as a computer program product comprising computer readable instructions that may be executed by a processing element. In a further embodiment, the elements of the clock and data recovery processor may be provided as addition or additional function or method to the firmware or operating system of a processing element that is already present in the respective application.

In addition, it is understood, that any required supporting or additional hardware may be provided such as, for example, a power supply circuitry and clock generation circuitry.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
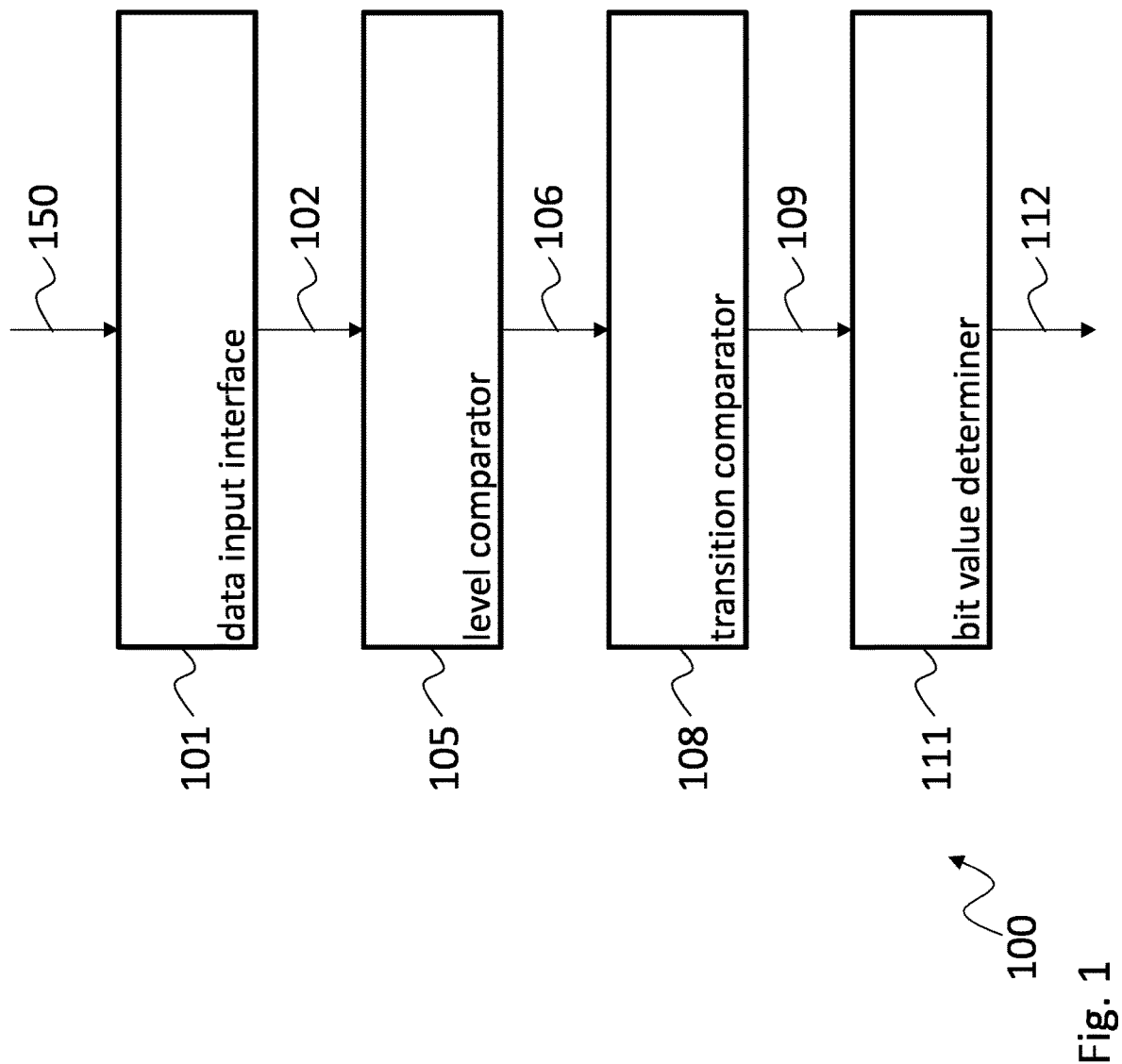
FIG. 1 shows a block diagram of an embodiment of a clock and data recovery processor according to the present disclosure.

FIG. 1 shows a block diagram of a clock and data recovery processor 100. The clock and data recovery processor 100 serves for recovering information, i.e., the symbol timing and the symbol values, from a measured signal 150.

The clock and data recovery processor 100 comprises a data input interface 101 that is coupled to a level comparator 105. The level comparator 105 is coupled to a transition comparator 108, and the transition comparator 108 is coupled to a bit value determiner 111.

The data input interface 101 receives samples 102 representing the measured signal 150 and provides the respective samples 102 to the level comparator 105. The level comparator 105 then determines the signal level 106 for each of the received samples 102 in a respective group comprising a predetermined number of samples.

Determining the signal level 106 in this regard refers to determining if the respective sample represents a digital 1 or 0 i.e., if the respective sample has the value representing a digital 1 or 0 in the electronic system in which the signal 150 is measured.

The transition comparator 108 determines the number of signal transmissions 109 and compares the number of signal transitions 109 for the samples 102 in the group with a predetermined transition number. The number of signal transmissions 109 may simply be determined by determining the number of changes from one signal level to another in consecutive samples of a group. The predetermined number may be given for a respective electronic system and may vary from application to application.

After determining that the number of signal transitions 109 is equal to or larger than the predetermined transition number, the bit value determiner 111 determines the bit values 112 for the data symbols in the measured signal 150 based on the detected transitions i.e., by determining the sample timing based on the detected transitions.

Figure 2:
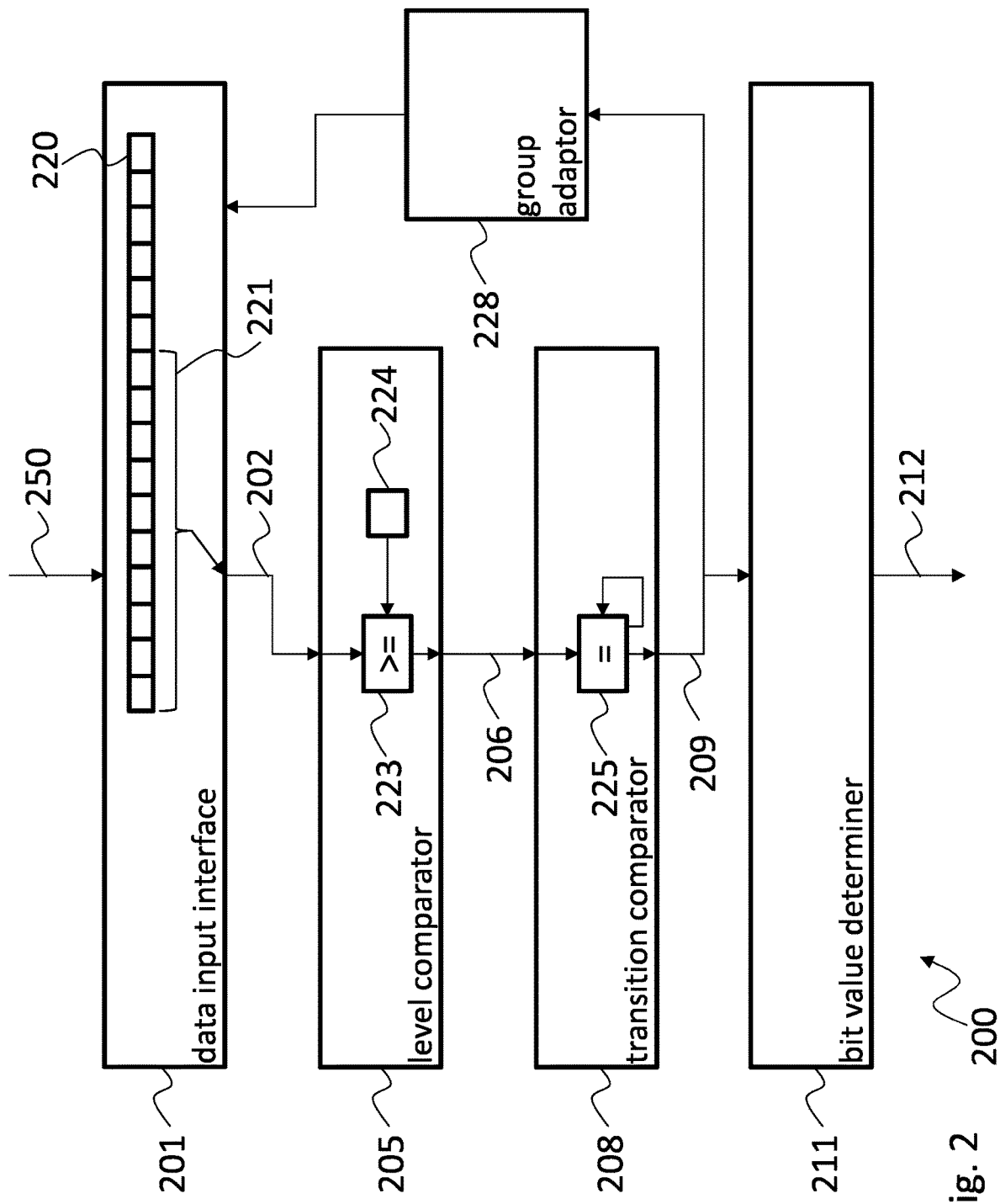
FIG. 2 shows a block diagram of another embodiment of a clock and data recovery processor according to the present disclosure.

FIG. 2 shows a block diagram of a clock and data recovery processor 200. The clock and data recovery processor 200 is based on the clock and data recovery processor 100. Therefore, the clock and data recovery processor 200 comprises a data input interface 201 for receiving a measured signal 250 that is coupled to a level comparator 205. The level comparator 205 is coupled to a transition comparator 208, and the transition comparator 208 is coupled to a bit value determiner 211 that determines the bit values 212. In general, the explanations provided above regarding the clock and data recovery processor 100 also apply to the clock and data recovery processor 200.

In addition, in the data input interface 201 a sample memory 220 is provided that holds the samples 202 that represent a respective group 221 and that are provided to the level comparator 205. In the level comparator 205 a comparator 223 compares the signal level provided in the samples 202 with a threshold value 224 and determines if the respective signal level is higher than the threshold value 224 or not. The comparator 223 may output a 1 or 0, depending on the result of the comparison.

In the transition comparator 208 the results provided by the level comparator 205 are consecutively compared to each other by comparator and counter 225, which increases an internal counter value by 1 for each transition between two signal levels 206.

The clock and data recovery processor 200 further comprises a group adaptor 228. The group adaptor 228 is coupled to transition comparator 208 and changes the respective group 221 in case that the number of signal transmissions 209 is lower than a predetermined threshold.

The group adaptor 228 may, for example, increase the number of samples 209 in the group 221 and the level comparator 205 may then re-determine the signal level 206 for each of the received samples 202 in the group 221 until the number of samples 209 in the group is equal to or higher than the predetermined transition number.

The level comparator 205 may also use a different sample 202 as the first sample of the group 221 when re-determining the signal levels 206 than used as the first sample for the group 221 in the prior determining of the signal levels 206. It is understood, that the data input interface 201 may provide a respectively modified group 221 from the sample memory 220.

Figure 3:
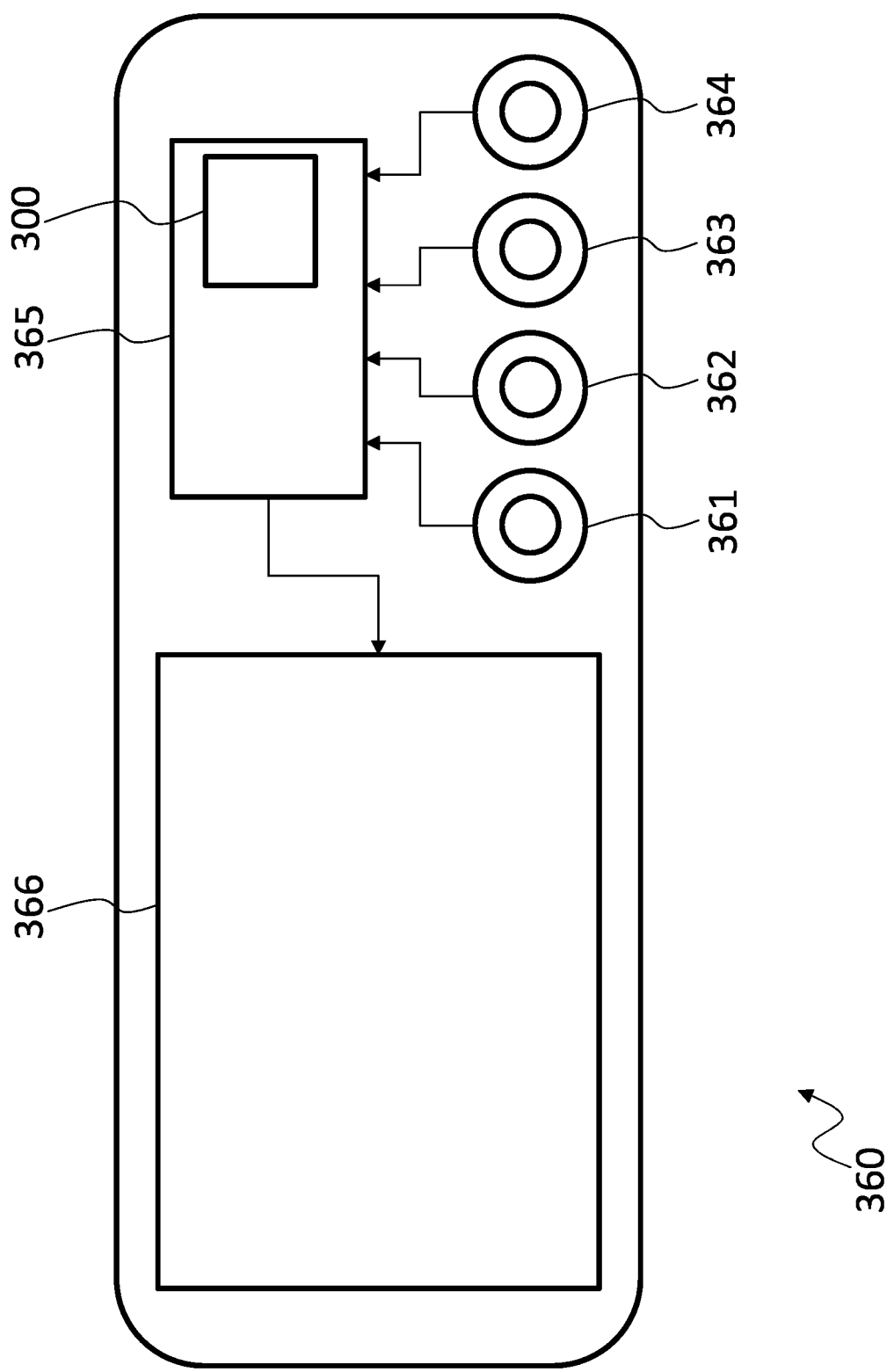
FIG. 3 shows a block diagram of an embodiment of a measurement device according to the present disclosure.

FIG. 3 shows a block diagram of an embodiment of a measurement device 360. The measurement device 360 comprises four measurement interfaces 361, 362, 363, 364, which are shown as BNC connectors on the front of the measurement device 360. The measurement interfaces 361, 362, 363, 364 are coupled to a processor 365 of the measurement device 360 and the processor 365 is coupled to a display 366 of the measurement device 360. It is understood, that the number of four measurement interfaces 361, 362, 363, 364 is just exemplary and that any other number of measurement interfaces may be provided.

In the measurement device 360 a clock and data recovery processor 300 is provided as part of the processor 365. It is understood that the clock and data recovery processor 300 may be a clock and data recovery processor according to any one of the embodiments presented herein.

In the shown embodiment, the clock and data recovery processor 300 may be provided as a function or program computer product that is executed by the processor 365. It is understood, that in other embodiments, the clock and data recovery processor 300 may be provided as a dedicated unit in the measurement device 360, for example, as an FPGA that is coupled to an acquisition memory of the clock and data recovery processor 300 and that is provided in the signal path between the measurement interfaces 361, 362, 363, 364 and the processor 365. The clock and data recovery processor 300 may in such an embodiment store the bit values of the samples or data symbols in a data memory of the measurement device 360 that may be coupled with the processor 365 for displaying of the data on the display 366.

For sake of clarity in the following description of the method-based FIGS. 4 to 5 and FIG. 6 the reference signs used above in the description of apparatus based FIGS. 1 to 3 will be maintained.

Figure 4:
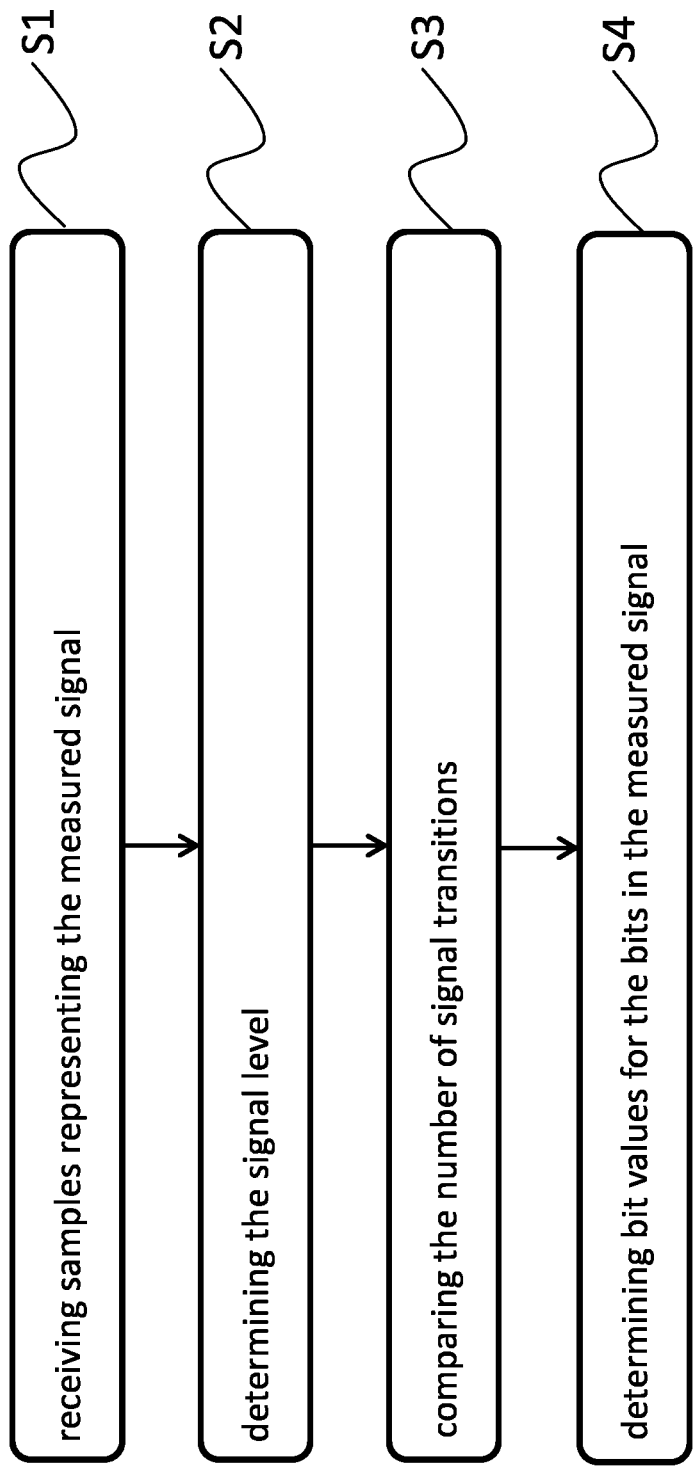
FIG. 4 shows a flow diagram of an embodiment of a method according to the present disclosure.

FIG. 4 shows a flow diagram of an embodiment of a clock and data recovery method for recovering information from a measured signal 150, 250.

The clock and data recovery method comprises receiving S1 samples 102, 202 representing the measured signal 150, 250, determining S2 the signal level 106, 206 for each of the received samples 102, 202 in a group 221, 470, 471, 472, 473, 474, 475, 476, 477 comprising a predetermined number of samples 102, 202, comparing S3 the number of signal transitions 109, 209 for the samples 102, 202 in the group 221, 470, 471, 472, 473, 474, 475, 476, 477 with a predetermined transition number, and determining S4 bit values 112, 212 for the data symbols in the measured signal 150, 250 based on the detected transitions, if the number of signal transitions 109, 209 is equal to or larger than the predetermined transition number.

In embodiments, for groups that comprise no transitions the increasing of the number of samples 102, 202 and the re-determining is skipped.

Figure 5:
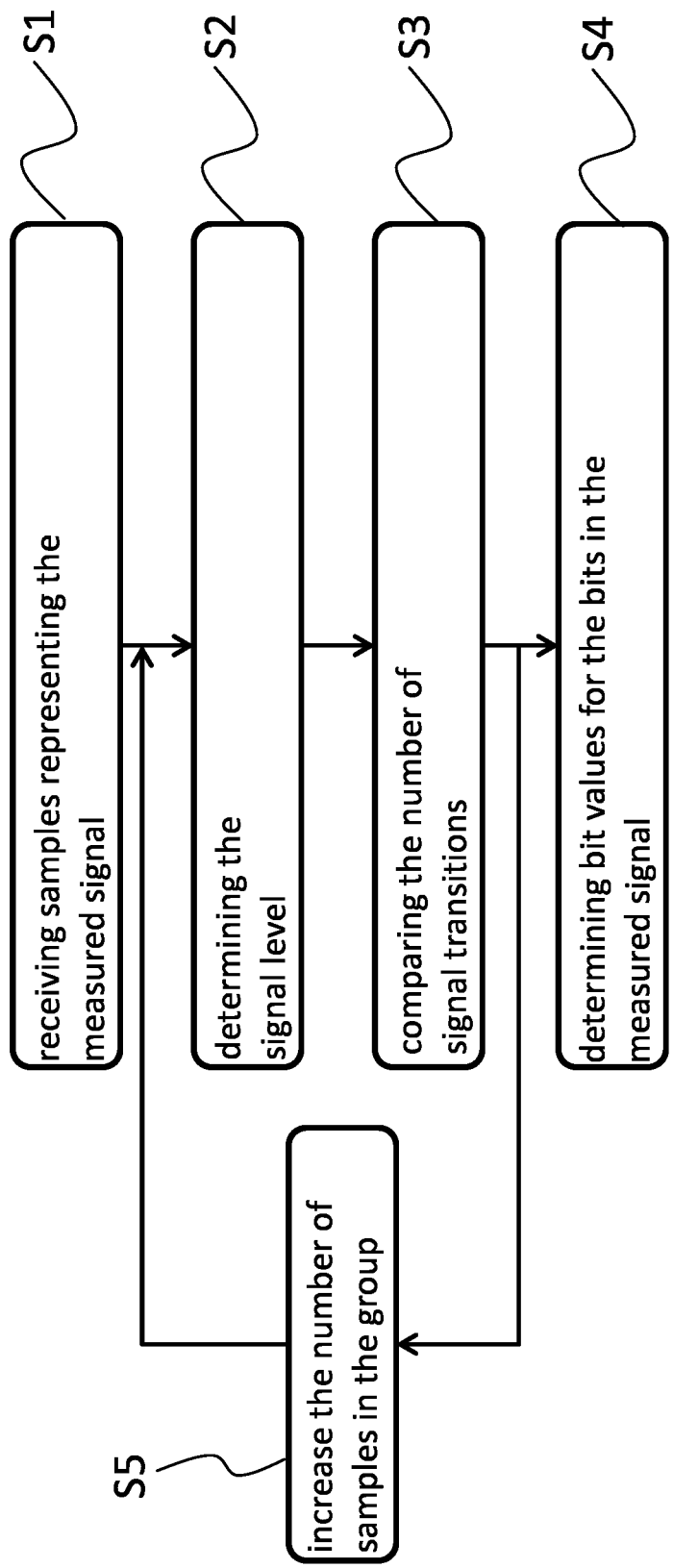
FIG. 5 shows a flow diagram of another embodiment of a method according to the present disclosure.

FIG. 5 shows a flow diagram of an embodiment of a method that is based on the method of FIG. 4. The clock and data recovery method of FIG. 4 therefore also comprises receiving S1 samples 102, 202 representing the measured signal 150, 250, determining S2 the signal level 106, 206 for each of the received samples 102, 202 in a group 221, 470, 471, 472, 473, 474, 475, 476, 477 comprising a predetermined number of samples 102, 202, comparing S3 the number of signal transitions 109, 209 for the samples 102, 202 in the group 221, 470, 471, 472, 473, 474, 475, 476, 477 with a predetermined transition number, and determining S4 bit values 112, 212 for the data symbols in the measured signal 150, 250 based on the detected transitions, if the number of signal transitions 109, 209 is larger than the predetermined transition number.

In addition, the clock and data recovery method of FIG. 5 comprises increasing S5 the number of samples 102, 202 in the group 221, 470, 471, 472, 473, 474, 475, 476, 477 if the number of signal transitions 109, 209 in the group 221, 470, 471, 472, 473, 474, 475, 476, 477 is below the predetermined transition number, and re-determining the signal level 106, 206 for each of the received samples 102, 202 in the group 221, 470, 471, 472, 473, 474, 475, 476, 477 with the increased sample number.

Increasing S5 may comprise increasing the number of samples 102, 202 in the group 221, 470, 471, 472, 473, 474, 475, 476, 477 by adding a predetermined amount to the predetermined number.

Increasing the number of samples 102, 202 in the group 221, 470, 471, 472, 473, 474, 475, 476, 477 and re-determining the signal level 106, 206 for each of the received samples 102, 202 in the group 221, 470, 471, 472, 473, 474, 475, 476, 477 may be repeated until the number of samples 102, 202 in the group 221, 470, 471, 472, 473, 474, 475, 476, 477 is equal to or higher than the predetermined transition number.

In addition, the group 221, 470, 471, 472, 473, 474, 475, 476, 477 may be moved. This means that when re-determining the signal level 106, 206, a different sample 102, 202 may be used as the first sample 102, 202 of the group 221, 470, 471, 472, 473, 474, 475, 476, 477 than used as the first sample 102, 202 for the group 221, 470, 471, 472, 473, 474, 475, 476, 477 in the prior determining of the signal levels 106, 206. Especially, a sample 102, 202 may be used, which is recorded later than a first sample 102, 202 for the group 221, 470, 471, 472, 473, 474, 475, 476, 477 in the prior determining.

Figure 6:
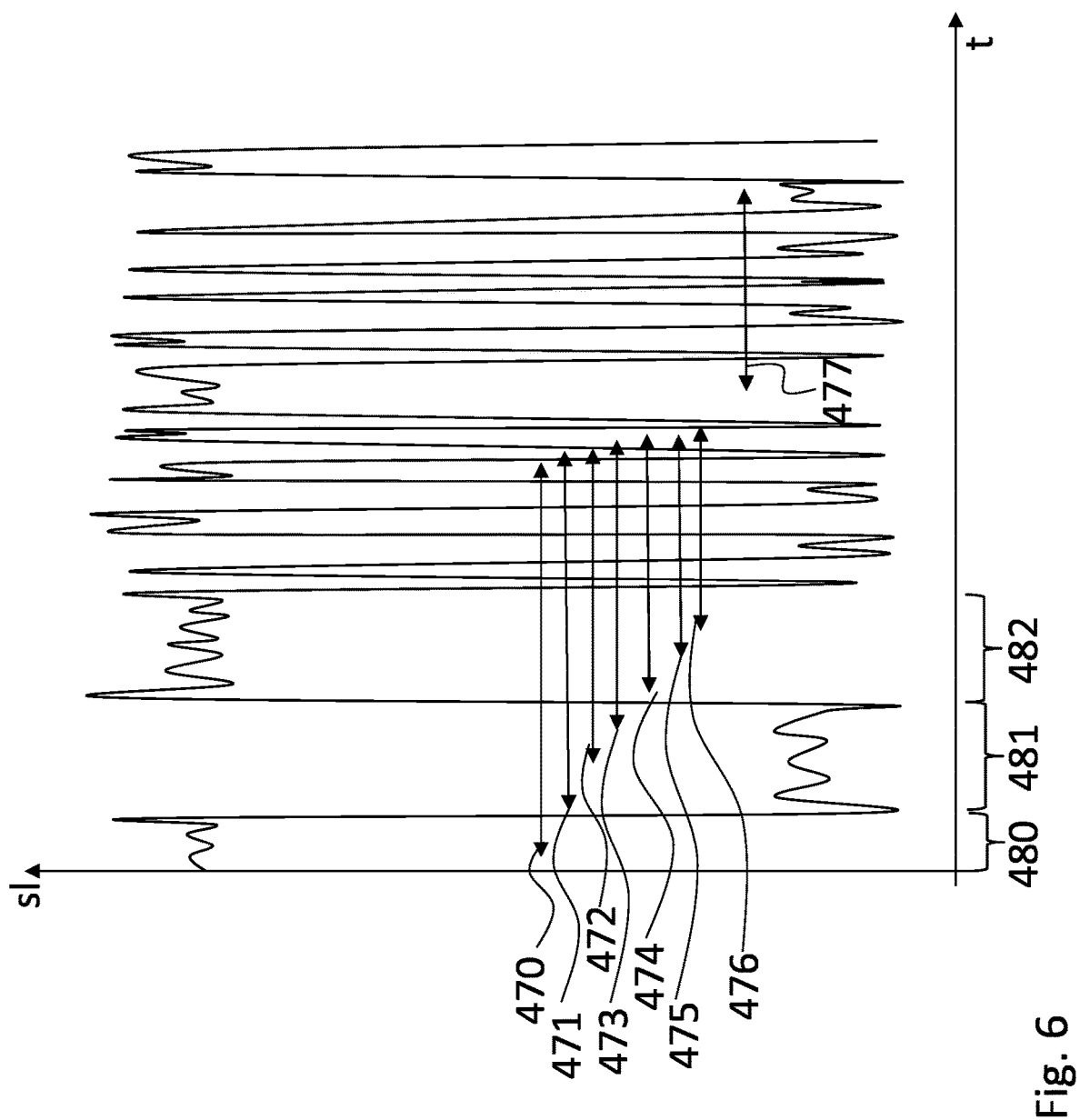
FIG. 6 shows a diagram of a signal that may be provided to an embodiment of a clock and data recovery processor according to the present disclosure.

FIG. 6 shows a diagram of a signal that may be provided to an embodiment of a clock and data recovery processor 100, 200, 300 according to the present disclosure. The diagram shows the signal level "sl" in the vertical axis and the time "t" or sample number in the horizontal axis.

The signal comprises three sections or patterns 480, 481, 482 at the beginning that have constant signal levels that represent 1, 0, and 1, respectively, over an increased period of time, and do not comprise any internal transitions. Only after these patterns 480, 481, 482, a data transmission comprising regular transitions is visible in the signal.

In the diagram of FIG. 6 multiple arrows are shown that represent groups 470-477. Groups 470-476 represent groups of samples 102, 202 that are recorded comprising at least one of the patterns 480, 481, 482. It can be seen, that the starting point of the groups 470-476 is shifted to a later point as well as the end point in each next group 470-476. The length of the groups 470-476 is chosen such that 8 or 9 transitions are present in each one of the groups.

Group 477 represents the signal at a later point in time during normal data transmission, where no special patterns are present that comprise only zeros or ones. The length of group 477 is chosen such that it comprises 9 transitions.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

LIST OF REFERENCE SIGNS

| | |
|---|---|
| 100, 200, 300 | clock and data recovery processor |
| 101, 201 | data input interface |
| 102, 202 | sample |
| 105, 205 | level comparator |
| 106, 206 | signal level |
| 108, 208 | transition comparator |
| 109, 209 | number of signal transitions |
| 111, 211 | bit value determiner |
| 112, 212 | bit value |
| 220 | sample memory |
| 221 | group |
| 223 | comparator |
| 224 | threshold value |
| 225 | comparator/counter |
| 228 | group adaptor |
| 150, 250 | measured signal |
| 360 | measurement device |
| 361, 362, 363, 364 | measurement interface |
| 365 | processor |
| 366 | display |
| 470, 471, 472, 473, 474, 475, 476, 477 | group |
| 480, 481, 482 | pattern |
| S1, S2, S3, S4 | method steps |

The invention claimed is:

1. A clock and data recovery processor for recovering information from a measured signal, the clock and data recovery processor comprising:
    a data input interface configured to receive samples representing the measured signal;
    a level comparator coupled to the data input interface and configured to determine the signal level for each of the received samples in a group comprising a predetermined number of samples;
    a transition comparator coupled to the level comparator and configured to determine a number of signal transitions in the group and to compare the number of signal transitions for the samples in the group with a predetermined transition number; and
    a bit value determiner coupled to the transition comparator and configured to determine bit values for data symbols in the measured signal based on the detected transitions, if the transition comparator determined the number of signal transitions being equal to or larger than the predetermined transition number.

2. The clock and data recovery processor according to claim 1, comprising a group adaptor configured to increase the number of samples in the group if the number of signal transitions in the group is below the predetermined transition number;
    wherein the level comparator is configured to re-determine the signal level for each of the received samples in the group with the sample number increased by the group adaptor.

3. The clock and data recovery processor according to claim 2, wherein the group adaptor is configured to increase the number of samples in the group by adding a predetermined amount to the predetermined number.

4. The clock and data recovery processor according to claim 2, wherein the group adaptor is configured to increase the number of samples in the group and the level comparator is configured to re-determine the signal level for each of the received samples in the group until the number of samples in the group is equal to or higher than the predetermined transition number.

5. The clock and data recovery processor according to claim 2, wherein the level comparator is configured to use a different sample as the first sample of the group when re-determining the signal level than used as the first sample for the group in the prior determining of the signal levels.

6. The clock and data recovery processor according to claim 5, wherein the level comparator is configured to use a sample, which is recorded later than a first sample for the group in the prior determining, as the first sample of the group when re-determining the signal level.

7. The clock and data recovery processor according to claim 1, wherein the level comparator and/or the transition comparator and/or the bit value determiner are configured to disregard groups that comprise no transitions.

8. A measurement device comprising:
a number of signal interfaces configured to measure a signal, and
a clock and data recovery processor for each one of the signal interfaces and coupled to the respective signal interface;
wherein the clock and data recovery processor is configured to perform a method for recovering information from a measured signal, the method comprising to:
receive samples representing the measured signal;
determine the signal level for each of the received samples in a group comprising a predetermined number of samples;
compare the number of signal transitions for the samples in the group with a predetermined transition number; and
determine bit values for data symbols in the measured signal based on the detected transitions, if a transition comparator determined the number of signal transitions being equal to or larger than the predetermined transition number.

9. A clock and data recovery method for recovering information from a measured signal, the clock and data recovery method comprising:
receiving samples representing the measured signal;
determining the signal level for each of the received samples in a group comprising a predetermined number of samples;
comparing the number of signal transitions for the samples in the group with a predetermined transition number; and
determining bit values for data symbols in the measured signal based on the detected transitions, if a transition comparator determined the number of signal transitions being equal to or larger than the predetermined transition number.

10. The clock and data recovery method according to claim 9, comprising increasing the number of samples in the group if the number of signal transitions in the group is below the predetermined transition number; and
re-determining the signal level for each of the received samples in the group with the increased sample number.

11. The clock and data recovery method according to claim 10, wherein increasing comprises increasing the number of samples in the group by adding a predetermined amount to the predetermined number.

12. The clock and data recovery method according to claim 10, wherein increasing the number of samples in the group and re-determining the signal level for each of the received samples in the group is repeated until the number of samples in the group is equal to or higher than the predetermined transition number.

13. The clock and data recovery method according to claim 10, wherein when re-determining the signal level, a different sample is used as the first sample of the group than used as the first sample for the group in the prior determining of the signal levels.

14. The clock and data recovery method according to claim 13, wherein when re-determining the signal level, a sample is used, which is recorded later than a first sample for the group in the prior determining, as the first sample of the group.

15. The clock and data recovery method according to claim 10, wherein for groups that comprise no transitions the increasing of the number of samples and the re-determining is skipped.

* * * * *